("12") United States Patent
Adusumilli et al.

(10) Patent No.: US 10,128,188 B2
(45) Date of Patent: Nov. 13, 2018

(54) HIGH ASPECT RATIO CONTACT METALLIZATION WITHOUT SEAMS

(71) Applicant: INTERNATIONAL BUSINESS MACHINES CORPORATION, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 15/082,902

(22) Filed: Mar. 28, 2016

(65) Prior Publication Data
US 2017/0278800 A1 Sep. 28, 2017

(51) Int. Cl.
*H01L 21/4763* (2006.01)
*H01L 23/532* (2006.01)
*H01L 21/768* (2006.01)
*H01L 21/3213* (2006.01)
*H01L 21/285* (2006.01)
*H01L 23/485* (2006.01)

(52) U.S. Cl.
CPC .. *H01L 23/53266* (2013.01); *H01L 21/28556* (2013.01); *H01L 21/28568* (2013.01); *H01L 21/32133* (2013.01); *H01L 21/7685* (2013.01); *H01L 21/76834* (2013.01); *H01L 21/76877* (2013.01); *H01L 23/485* (2013.01)

(58) Field of Classification Search
CPC .............. H01L 21/76885; H01L 23/485
USPC .................................................. 438/648
See application file for complete search history.

(56) References Cited

U.S. PATENT DOCUMENTS

| 5,622,894 | A |   | 4/1997 | Jang et al. |
| 5,747,379 | A |   | 5/1998 | Huang et al. |
| 6,034,439 | A | * | 3/2000 | Teng .............. H01L 24/03 257/763 |
| 6,077,780 | A |   | 6/2000 | Dubin |
| 6,169,030 | B1 |  | 1/2001 | Naik et al. |
| 6,448,649 | B1 |  | 9/2002 | Lee et al. |
| 6,566,759 | B1 |  | 5/2003 | Conrad et al. |
| 8,232,647 | B2 |  | 7/2012 | Yang et al. |

(Continued)

OTHER PUBLICATIONS

Kondo, Kazuo et al., High-Aspect-Ratio Copper-Via-Filling for Three-Dimensional Chip Stacking, Journal of the Electrochemical Society, 152 (11), 2005, pp. H173-H177.

(Continued)

*Primary Examiner* — Hsin-Yi Hsieh
(74) *Attorney, Agent, or Firm* — Daniel P. Morris, Esq.; Hoffmann & Baron, LLP

(57) ABSTRACT

A low resistance middle-of-line interconnect structure is formed without liner layers. A contact metal layer is deposited on source/drain regions of field-effect transistors and directly on the surfaces of trenches within a dielectric layer using plasma enhancement. Contact metal fill is subsequently provided by thermal chemical vapor deposition. The use of low-resistivity metal contact materials such as ruthenium is facilitated by the process. The process further facilitates the formation of metal silicide regions on the source/drain regions.

11 Claims, 4 Drawing Sheets

(56) References Cited

U.S. PATENT DOCUMENTS 8,691,697 B2    4/2014  Booth, Jr. et al.
2013/0207270 A1*  8/2013  Holmes ................ H01L 23/485
                                                              257/763

OTHER PUBLICATIONS

Han, Jungjin et al., Elimination of nanovoids induced during electroforming of metallic nanostamps with high-aspect-ratio nanostructures by the pulse reverse current electroforming process, Journal of Micromechanics and Microengineering 22, 2012, pp. 1-10.

* cited by examiner

HIGH ASPECT RATIO CONTACT METALLIZATION WITHOUT SEAMS

BACKGROUND

The present disclosure relates generally to the electrical, electronic and computer arts and, more particularly, to contact metallization processes and contact structures.

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

The contribution of middle-of-line (MOL) contact resistance to the total parasitic resistance is increasing due to aggressive dimensional scaling in advanced CMOS devices. Titanium (Ti), titanium nitride (TiN) and tungsten (W) layers are used as liner/barrier/nucleation layers in MOL metallization and help ensure adequate adhesion. These layers occupy an increasing amount of the interconnect volume. Interfacial contact resistance between two interconnect levels is dominated by liner/barrier/nucleation layers of some devices.

Silicon-based devices typically include multiple interconnect metallization layers above a device layer that contains field-effect transistors (FETs), memory devices, or other structures. The metallization layers often include high aspect ratio holes or vias that are relatively deep and have narrow diameters. The ratio of the depth to the diameter (aspect ratio) of contact holes is often much greater than one. Tungsten (W) is frequently employed as a fill material for contact holes having narrow (sub-micron) diameters. Tungsten fill material is deposited conformally using, for example, low pressure chemical vapor deposition (LPCVD). As the dimensions of tungsten metal contacts are scaled down for future technology nodes, currently used metallization techniques may not be able to deliver structures that meet the resistance targets required. The need for thick TiN liners to prevent fluorine diffusion and poor metal gap fill due to seams or other void types contribute to the high resistance of scaled-down tungsten contacts. Such liners reduce contact hole diameter and thereby displace metal conductor volume that could otherwise be deposited within the contact hole.

Currently employed conformal deposition processes for damascene tungsten involve the use of tungsten hexafluoride ($WF_6$) as a source material for the tungsten. The TiN liner protects the underlying titanium and silicon from the fluorine that is released during deposition. The process of filling high aspect ratio contact holes using conformal deposition processes often results in the formation of vertical seams within the metal contacts. Such seams are formed near the convergence of the tungsten-coated side walls of the contact holes. The seams also displace metal conductor volume and could lead to higher resistance.

BRIEF SUMMARY

Techniques are provided for forming a seam-less interconnect metallization structure.

In one aspect, an exemplary fabrication method includes obtaining a structure including an interconnect layer and a patterned mandrel on the interconnect layer, the patterned mandrel including a plurality of columns. Each mandrel column includes sidewalls. A contact metal layer is conformally deposited on the structure such that vertically extending gaps are formed between portions of the contact metal layer lining the sidewalls of the columns. The contact metal layer is isotropically etched to form discrete vertical metal contact portions lining the sidewalls of the columns and electrically coupled to the interconnect layer. The patterned mandrel is removed and a dielectric layer is deposited over the interconnect layer and between the vertical metal contact portions.

Techniques as disclosed herein can provide substantial beneficial technical effects. By way of example only and without limitation, one or more embodiments may provide one or more of the following advantages:

Low resistance interconnect structure having high aspect ratio contact structures;

Metallization process that is compatible with existing metal deposition processes;

Elimination of seams within metal contact structures.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
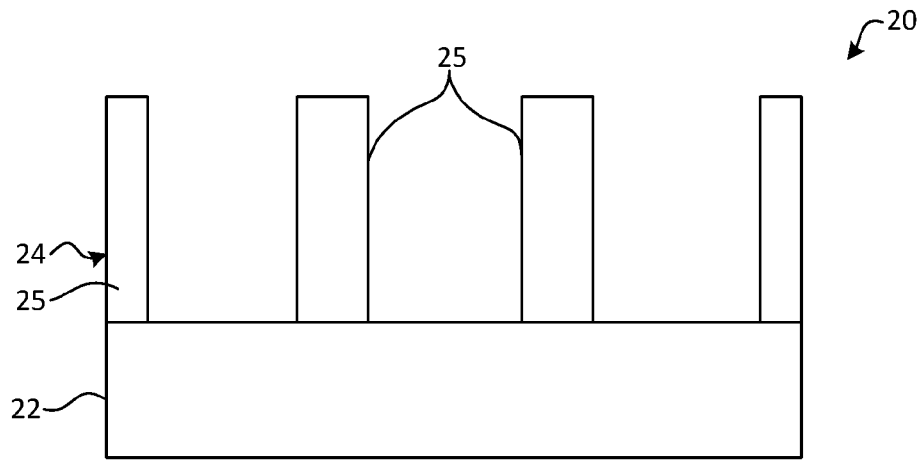
FIG. 1 is a schematic, cross-sectional view of a semiconductor structure including an interconnect layer having a patterned mandrel layer thereon.

FIG. 1 schematically depicts a semiconductor structure 20 including an interconnect layer 22 and a patterned mandrel layer 24 on the interconnect layer. The interconnect layer in some embodiments is a middle-of-line (MOL) layer having contacts aligned with source/drain regions of an underlying device layer (not shown) including field-effect transistors. The patterned mandrel layer can be formed from any suitable material, for example silicon nitride or amorphous carbon. A silicon nitride ($Si_3N_4$) layer can be deposited via CVD, PECVD, sputtering, or other suitable technique conformal deposition. Such deposition is followed by masking and removal of unwanted material using an anisotropic etching process such as reactive ion etching or plasma etching to provide the patterned mandrel layer 24. Amorphous carbon (a-C), if employed to form the mandrel layer, can be deposited using plasma-enhanced chemical vapor deposition (PECVD) or other suitable process. As known in the art, amorphous carbon can be deposited and patterned over a wide range of film thicknesses. For example, a silicon oxide hard-mask can be used as an etch mask to etch the a-C layer and form the patterned mandrel layer. The a-C layer can, for example, be selectively etched using an $N_2/H_2$ inductively coupled plasma (ICP), after which the hard-mask is removed. While the patterned mandrel layer 24 is shown as including fin-like columns 25 having vertical sidewalls, it will be appreciated that the sidewall angles may not be entirely vertical. The thickness of the patterned mandrel layer 24 is between 100-2,000 Å in some exemplary embodiments. The top surface of the interconnect layer 22 between the columns 25 is exposed. The areas between the columns expose the portions of the interconnect layer 22 to which electrical connections are to be made. The distance(s) between mandrel columns 25 can be, in part, a function of the column width(s). In some embodiments, the mandrel columns are the same in width and the distance between mandrel columns is two to four times column width. For example, in one embodiment column width is ten nanometers (10 nm) and the distance between each column is between twenty and forty nanometers.

Figure 2:
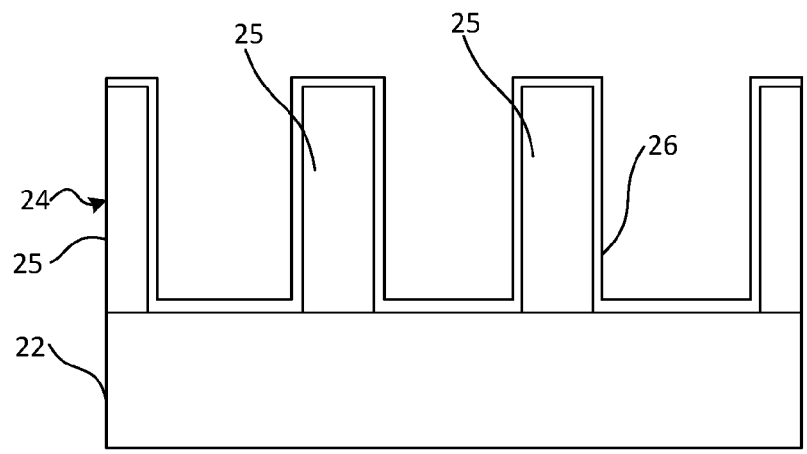
FIG. 2 is a schematic, cross-sectional view thereof following deposition of a titanium nitride liner.

A titanium nitride (TiN) layer is deposited on the structure, as shown in FIG. 2. The TiN layer may have a thickness of about ten to forty Angstroms (10-40 Å) in embodiments wherein a tungsten metallization is later employed and can be deposited using any suitable deposition process, for example, atomic layer deposition or sputtering. The titanium nitride layer forms a liner 26 on the columns 25 and the exposed surfaces of the interconnect layer 22 between the columns. In some embodiments, a bilayer metal liner is deposited on the structure. For example, a titanium layer may be conformally deposited on the structure, lining the surfaces of the dielectric columns 25 and the exposed portions of the interconnect layer 22. The thickness of the titanium layer is between 30-80 Å in some embodiments. Radio-frequency enhanced physical vapor deposition (RF PVD) is a known technique for depositing thin metal films, and may be employed for depositing the titanium layer. The TiN layer is then deposited on the titanium layer to form the liner 26. Bilayer liners including TiN and tungsten nitride (WN) may be employed in other alternative embodiments. A conformal layer of tungsten nitride can be deposited using atomic layer deposition (ALD).

Figure 3:
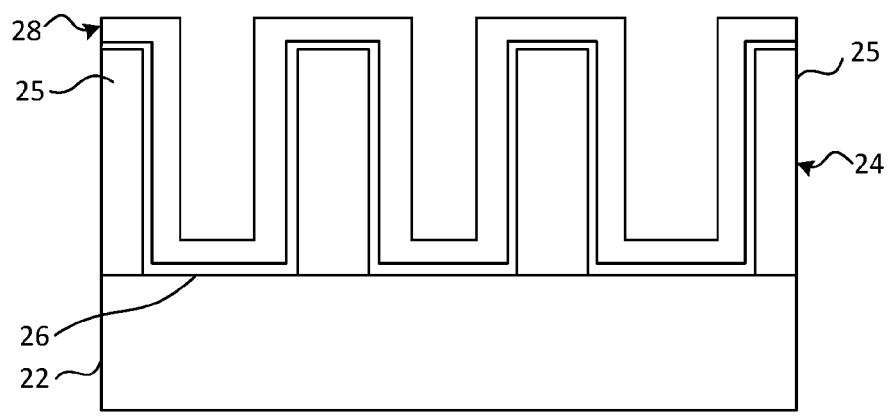
FIG. 3 is a schematic, cross-sectional view thereof following deposition of a contact metal layer.

A contact metal layer 28 is deposited on the structure and directly contacts the TiN layer 26. The distance(s) between columns 25 of the mandrel layer 24 ensure that seams are not formed in the deposited metal layer. As discussed above, the distance between mandrel columns is in a range to two to four times the widths of the columns in an exemplary embodiment. The thickness of the deposited metal layer in such an exemplary embodiment can be 0.5 to 1.5 times the mandrel width. In an embodiment wherein mandrel column width is ten nanometers (10 nm) and the space between mandrel columns is twenty nanometers (20 nm), the metal layer 28 could be deposited up to a thickness of five nanometers (5 nm). The lower limit for deposited contact metal is about one nanometer in order to ensure that a continuous metal film is formed. In an alternative embodiment, mandrel column width is ten nanometers (10 nm), the distance between mandrel columns 25 is forty nanometers (40 nm), and the deposited contact metal is a maximum of fifteen nanometers (15 nm) in thickness. Gaps 27 between vertical portions 28A of the contact metal layer are accordingly formed between mandrel columns 25, as schematically illustrated in FIG. 3. In some embodiments, the contact metal layer 28 is a tungsten (W) layer that is deposited using a tungsten hexafluoride source with silane. Chemical vapor deposition conducted between 300-400° C. using tungsten hexafluoride precursor chemistry may, for example, be employed to deposit a tungsten layer. Plasma enhanced CVD, thermal CVD, and atomic layer deposition are other possible options for depositing a conformal tungsten layer. The thickness of a tungsten metal contact layer is between five and fifteen nanometers (5-15 nm) in some exemplary embodiments.

It will be appreciated that other low resistivity materials may be employed as contact metals in alternative embodiments. Such materials include aluminum, cobalt, nickel, molybdenum, ruthenium, iridium, rhodium, osmium and their alloys. Halide-based or metal-organic precursors may be employed to form conformal layers using one or more of the materials. Cobalt may, for example, be deposited using a metal-organic precursor in a CVD process at a temperature range of 150–200° C. Ruthenium may be deposited using thermal CVD at 1.5 Torr and at a process temperature of 250-350° C. The use of a non-halide precursor molecule, for example a metal-organic precursor as known in the art, eliminates the need for a halide-diffusion barrier in embodiments where some contact metals, for example ruthenium, are employed during MOL metallization as described herein. Deposition times are controlled to obtain layers of desired thickness. The processes disclosed herein facilitate the use of metals in middle-of-line (MOL) interconnect layers that may not satisfactorily fill deep, narrow pre-formed openings within such interconnect layers. Deposition processes for conformally depositing low-resistivity metals other than tungsten, cobalt and ruthenium are familiar to those of skill in the art and can be employed herein. Isotropic etch processes for metals other than tungsten, cobalt and ruthenium are also known in the art.

Figure 4:
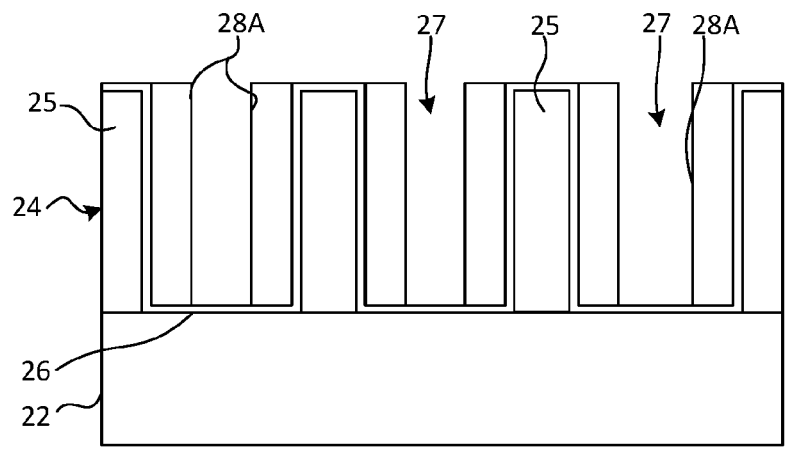
FIG. 4 is a schematic, cross-sectional view thereof following a directional etch of the contact metal layer.
Figure 5:
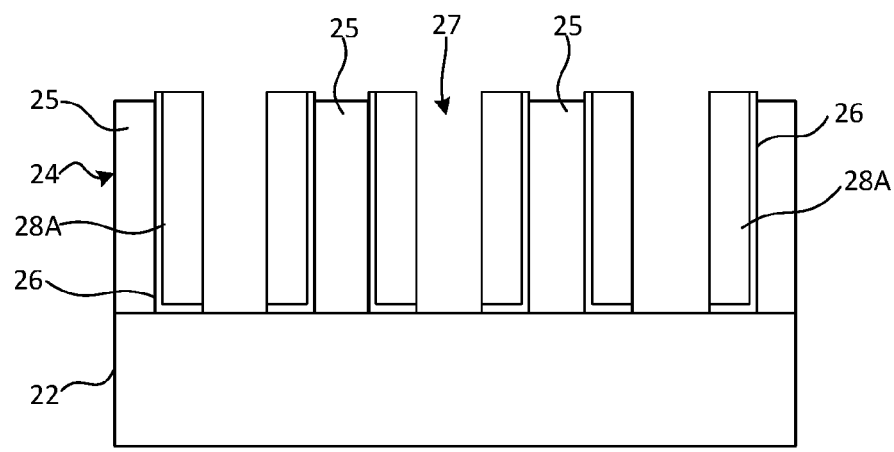
FIG. 5 is a schematic, cross-sectional view thereof following a directional etch of the titanium nitride liner.

The horizontal portions or the contact metal layer 28 are removed using a directional etch, thereby isolating the portions of the contact metal layer lining the side walls of the columns 25 from each other. A reactive ion etch employing, for example, fluorine-based chemistry is an isotropic etch process that may be used to remove the selected portions of the contact metal layer 28 to form discrete, vertically extending contact metal portions. The portions of the contact metal layer above the mandrel layer 24 can be removed using such an etch process and/or by chemical mechanical planarization (CMP). As shown in FIG. 4, the portions of the liner 26 between the remaining vertical portions 28A of the contact metal layer 28 are exposed. Directional removal of the exposed portions of the liner 26 is conducted using a reactive ion etch employing, for example, chlorine-based chemistry. The portions of the liner 26 between the vertical metal contact portions 28A and the mandrel columns 25 and between the vertical metal contact portions 28A and the interconnect layer 22 remain intact, as schematically illustrated in FIG. 5. The vertical metal contact portions 28A are electrically isolated from each other at this stage of the process, though electrically connected to the underlying interconnect layer 22.

Figure 6:
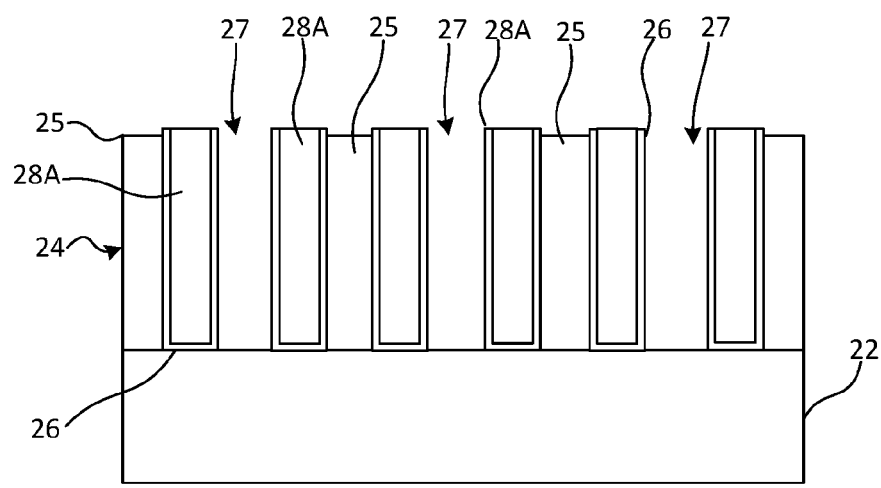
FIG. 6 is a schematic, cross-sectional view thereof following deposition of a second titanium nitride liner and subsequent directional etch.

Referring to FIG. 6, electrically conductive liner material such as TiN is conformally deposited on the structure followed by a directional etch of the horizontal portions thereof. The new liner includes the same material(s) and is deposited using the same technique(s) employed in forming the original liner described above with respect to FIG. 2 in an exemplary embodiment. The thickness of the new liner is also the same as the thickness of the originally deposited liner in the exemplary embodiment. The liner 26 accordingly lines the sidewalls of the vertical metal contact portions 28A, including the sidewalls adjoining the gaps 27 between the vertical metal contact portions 28A. While the liner is deposited in two different steps, the same reference numeral is employed to designate the liner 26 in the figures. As further shown in FIG. 6, the second liner etch again exposes the interconnect layer 22.

Figure 7:
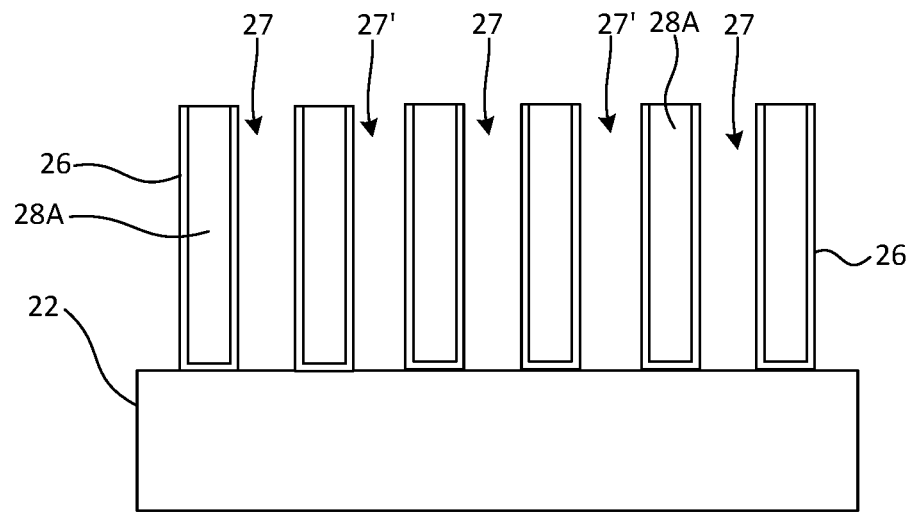
FIG. 7 is a schematic, cross-sectional view thereof following removal of the patterned mandrel layer.

The mandrel 24 is removed from the structure, thereby forming additional gaps 27' between the vertical metal contact portions 28A. The additional gaps 27' may or may not have the same dimensions as the originally formed gaps 27 and may or may not have the same dimensions as each other. The spacing of the vertical metal contact portions 28A may accordingly be uniform or nonuniform. In one exemplary embodiment shown in FIG. 7, the fin-like contact portions 28A have equal heights and widths and the gaps 27, 27' between contact portions have equal widths. In embodiments where an amorphous carbon mandrel is employed, an $N_2/H_2$-based plasma or an $O_2$ plasma-based ashing process can be employed to remove the mandrel. A nitride mandrel, if employed, can be selectively removed using an appropriate stripping process. Selective stripping processes for removing nitride masks, such as wet etching with phosphoric acid and plasma etching using various gas species, are known to the art and continue to be developed.

A dielectric layer 30, for example silicon dioxide, can be formed on the structure using CVD or other known techniques. Other low-k dielectrics can alternatively be employed to form the layer 30, for example SiOCH. The layer 30 may be planarized using chemical mechanical planarization (CMP), as known in the art to obtain the interconnect structure 31 shown in FIG. 8. The vertical metal contact portions 28A within the structure are seamless. The dielectric layer 30 fills the gaps between each of the vertical metal contact portions 28A. Being formed in a manner as described above rather than within openings formed in dielectric material that forms the layer 30, no seams are formed in the metal contact portions as they are fabricated. High aspect, void-free metal contact portions can accordingly be obtained in the resulting semiconductor assembly 32 that comprises the two electrically connected interconnect structures 22, 31. In some embodiments, the aspect ratios of the metal contact portions 28A are at least two to one (2:1). High aspect ratios in the range of two to twenty to one (2-20:1) are contemplated using the processes discussed herein.

Relatively low-resistance middle-of-line contact structures, such as the metal contact portions 28A described herein, facilitate adoption of scaled down technology nodes. The processes described herein may, if desired, employ currently existing conformal metal deposition and isotropic metal etch processes, allowing their implementation within existing facilities using existing tooling. It will be appreciated that new deposition and etch processes having application to the processes discussed herein may be developed and adopted.

Figure 9:
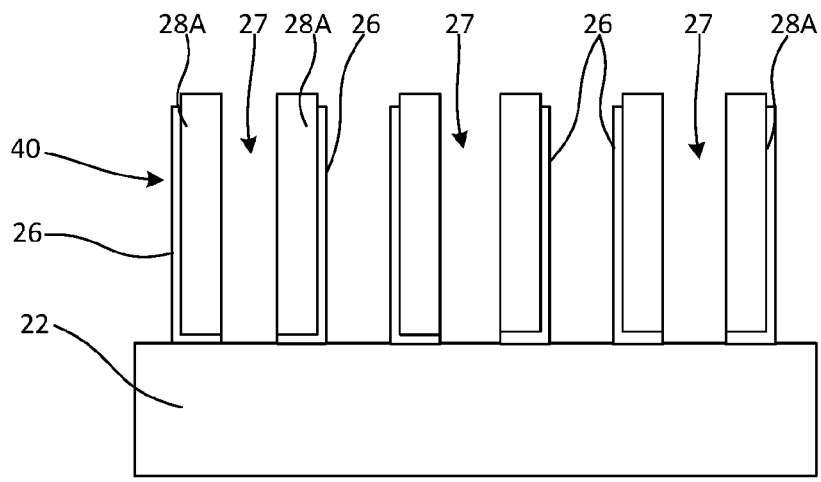
FIG. 9 is a schematic, cross-sectional view thereof following removal of the patterned mandrel layer from the structure shown in FIG. 5.
Figure 10:
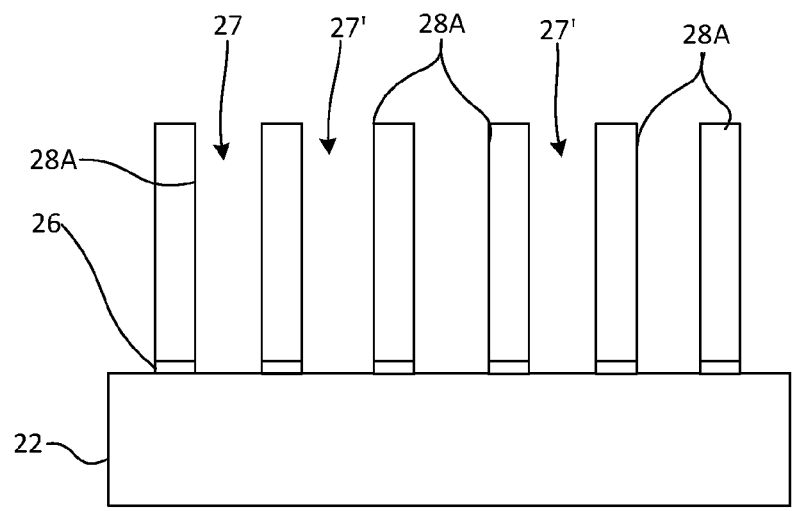
FIG. 10 is a schematic, cross-sectional view thereof following a directional etch of the titanium nitride liner on the structure shown in FIG. 9.
Figure 11:
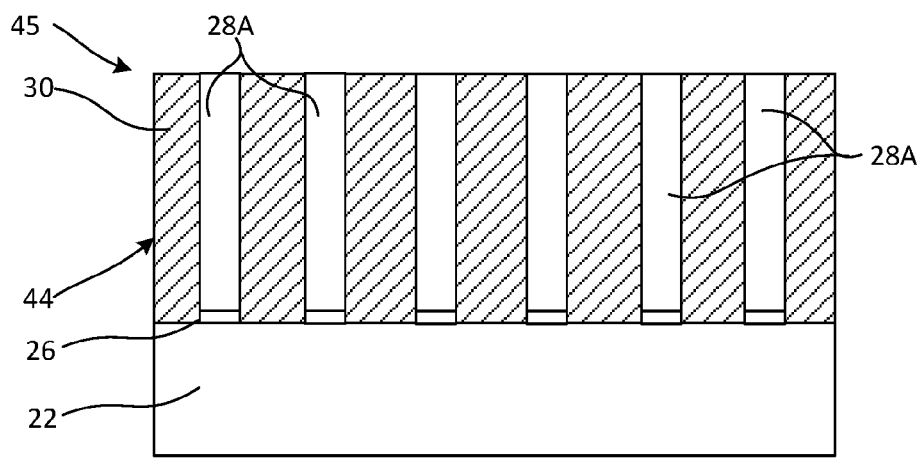
FIG. 11 is a schematic, cross-sectional view thereof following deposition of a dielectric layer on the structure shown in FIG. 10 followed by chemical mechanical planarization.

Exemplary steps of an alternative fabrication process for obtaining a MOL interconnect structure are schematically illustrated in FIGS. 9-11. The structure 40 schematically illustrated in FIG. 9 is obtained by first performing the steps discussed above with respect to FIGS. 1-5. The mandrel 24 is removed once a structure as shown in FIG. 5 is obtained. Processes for selectively removing dielectric mandrels are discussed above with respect to FIG. 7 and are applicable to the removal of the mandrel 24 from structures as shown in FIG. 5. The resulting structure 40 includes metal contact portions 28A formed from the vertically extending portions of the conformally deposited metal contact layer 28, the contact portions 28A extending vertically from the underlying interconnect layer 22. The liner 26 adjoins one sidewall and the bottom surface of each of the metal contact portions 28A. The structure 40 is subjected to a wet etch to remove the liner 26 from the sidewalls of the metal contact portions 28A. In embodiments where the liner consists essentially of a metal nitride such as TiN, a mixture of sulfuric acid and hydrogen peroxide (SPM) can be used to selectively remove the exposed portions of the liner 26. The seam-less, electrically isolated metal contact portions 28A include only a bottom liner following wet etching; the sidewalls are unlined. FIG. 10 schematically illustrates an exemplary structure. The metal contact portions 28A are equally spaced and have equal widths in some embodiments. In other embodiments, the spacing of the metal contact portions 28A is unequal. The aspect ratio of the seamless metal contact portions 28A is between two and twenty in some embodiments.

A dielectric layer 30, for example silicon dioxide, can be formed on the structure using CVD or other known techniques to obtain an interconnect structure 44 as schematically illustrated in FIG. 11. Other low-k dielectrics can alternatively be employed to form the layer 30, for example SiOCH. The layer 30 may be planarized using chemical mechanical planarization (CMP), as known in the art to obtain the structure 44. The vertical metal contact portions 28A within the structure are seamless. The dielectric layer 30 fills the gaps between each of the vertical metal contact portions 28A. The assembly 45 obtained includes first and second interconnect structures 22, 44 that are electrically connected by one or more of the metal contact portions 28A.

FIGS. 1-8 and 9-11, as discussed above, depict exemplary processing steps/stages in the fabrication of exemplary structures. Although the overall fabrication method and the structure formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1st *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Figure 8:
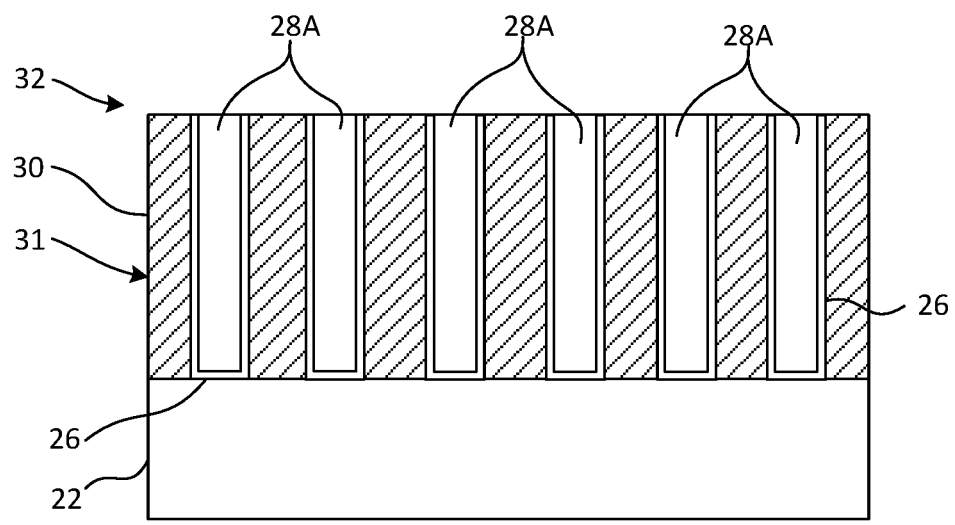
FIG. 8 is a schematic, cross-sectional view thereof following deposition of a dielectric layer and chemical mechanical planarization.

Given the discussion thus far, it will be appreciated that, in general terms, an exemplary fabrication method includes obtaining a structure including an interconnect layer 22 and a patterned mandrel 24 on the interconnect layer, the patterned mandrel including a plurality of columns 25. Each column includes sidewalls. A contact metal layer is conformally deposited on the structure such that vertically extending gaps 27 are formed between portions of the contact metal layer 28 lining the sidewalls of the columns 25. The gaps 27 are obtained by providing sufficient distance between mandrel columns in relation to the thickness of the deposited contact metal layer. The spaces between mandrel columns are not filled with contact metal, a process that could result in the formation of unwanted seams as opposed to gaps 27 as in the processes disclosed herein. An isotropic etching process is employed to etch the contact metal layer, thereby forming discrete vertical metal contact portions 28A lining the sidewalls of the mandrel columns 25, such as schematically illustrated in FIG. 4. The metal contact portions 28A are electrically coupled to the interconnect layer 22. (The interconnect layer 22 may, in turn, include electrical connections to field-effect transistors or other devices formed in an underlying structure.) The patterned mandrel 24 is removed and a dielectric layer is deposited over the interconnect layer 22 and between the vertical metal contact portions 28A. Exemplary structures 32, 45 are schematically illustrated in FIGS. 8 and 11. In some embodiments, the exemplary method further includes conformally depositing an electrically conductive liner 26 on the structure prior to conformally depositing the contact metal layer. The electrically conductive liner consists essentially of titanium nitride in some embodiments. Other liner materials or combinations of materials (e.g. Ti/TiN) may alternatively be employed. In some embodiments, the method further includes depositing an electrically conductive layer having the same composition as the electrically conductive liner on the structure following isotropically etching the contact metal layer 28 and prior to removing the patterned mandrel 24. FIG. 6 schematically illustrates a structure obtained following deposition of the electrically conductive layer. Directional etching may be used to remove portions of the electrically conductive liner and the electrically conductive layer between the vertical metal contact portions, leaving deposited material (e.g. TiN) on the sidewalls of the vertical metal contact portions 28A. In some embodiments, each of the columns 25 of the patterned mandrel has the same width and the mandrel columns 25 are separated from each other by a distance equal to two to four times the width of the mandrel columns. The thickness of the conformally deposited contact metal layer 28 is less than one and one-half times the width of the columns of the patterned mandrel to ensure the formation of gaps 27 between vertical metal contact portions 28A of the contact metal layer 28. In some embodiments, the vertical metal contact portions have aspect ratios between two and twenty. The columns 25 of the patterned mandrel 24 comprise parallel fin-like structures in one or more embodiments that allow the formation of fin-shaped vertical metal contact portions 28A. In some embodiments, the method further includes removing all portions of the electrically conductive liner except between the vertical metal contact portions and the interconnect layer to obtain a structure as schematically illustrated in FIG. 10. The vertical metal contact portions 28A in the structure obtained will accordingly have unlined sidewalls and electrically conductive liners in direct contact with only their bottom surfaces.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FET devices and contacts formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A fabrication method comprising:
   obtaining a structure including an interconnect layer and a patterned mandrel on the interconnect layer, the patterned mandrel including a plurality of columns, each of the columns including sidewalls;
   conformally depositing an electrically conductive liner on the structure;
   conformally depositing a contact metal layer on the electrically conductive liner such that vertically extending gaps are formed between portions of the contact metal layer lining the sidewalls of the columns;
   isotropically etching the contact metal layer to form discrete vertical metal contact portions lining the sidewalls of the columns and electrically coupled to the interconnect layer;
   removing the patterned mandrel;
   depositing a dielectric layer over the interconnect layer and between the vertical metal contact portions; and
   depositing an electrically conductive layer having the same composition as the electrically conductive liner on the structure following the isotropically etching the contact metal layer and prior to the removing the patterned mandrel.

2. The method of claim 1, further including directionally removing portions of the electrically conductive liner and the electrically conductive layer between the vertical metal contact portions.

3. The method of claim 2, wherein the electrically conductive liner consists essentially of titanium nitride.

4. The method of claim 2, wherein each of the columns of the patterned mandrel has the same width, and further wherein the columns are separated from each other by a distance equal to two to four times the width of the columns.

5. The method of claim 4, wherein a thickness of the conformally deposited contact metal layer is less than one and one-half times the width of the columns of the patterned mandrel.

6. The method of claim 5, wherein the discrete vertical metal contact portions have aspect ratios between two and twenty.

7. The method of claim 6, wherein the columns of the patterned mandrel comprise parallel fin-like structures.

8. The method of claim 1, wherein the contact metal layer consists essentially of tungsten.

9. The method of claim 1, wherein the contact metal layer is one of tungsten, cobalt and ruthenium.

10. The method of claim 1, wherein each of the columns of the patterned mandrel has the same width, and further wherein the columns are separated from each other by a distance equal to two to four times the width of the columns.

11. The method of claim 10, wherein a thickness of the conformally deposited contact metal layer is less than one and one-half times the width of the columns of the patterned mandrel.

* * * * *